United States Patent [19]
Dultz et al.

[11] Patent Number: 5,833,833
[45] Date of Patent: Nov. 10, 1998

[54] METHOD OF PREPARING A PYROELECTRIC MIXTURE AND PYROELECTRIC DEVICE

[75] Inventors: Wolfgang Dultz, Frankfurt am Main, Germany; Sergei Yablonsky, Moscow, U.S.S.R.; Eduardo Soto Bustamante; Leonid Beresnev, both of Darmstadt, Germany; Lev Blinov, Moscow, U.S.S.R.; Wolfgang Haase, Reinheim, Germany; Yuri Galyametdinov, Kazan, U.S.S.R.

[73] Assignee: Deutsche Telekom AG, Bonn, Germany

[21] Appl. No.: 772,203

[22] Filed: Dec. 20, 1996

[30] Foreign Application Priority Data

Dec. 22, 1995 [DE] Germany ............ 195 47 934.3

[51] Int. Cl.$^6$ .................. C25B 3/00; H01L 41/04
[52] U.S. Cl. ............ 205/414; 205/419; 310/800; 310/357
[58] Field of Search ................ 205/414, 419; 310/800, 357

[56] References Cited

U.S. PATENT DOCUMENTS 3,707,695 12/1972 Yamaka ........................ 338/18
5,100,589 3/1992 Ticknor ........................ 264/1.3
5,359,253 10/1994 Hikmet ........................ 310/357

FOREIGN PATENT DOCUMENTS 207347    1/1987  European Pat. Off. .
1-296216  11/1989 Japan .
8805722   8/1988  WIPO .

OTHER PUBLICATIONS

Blinov, L. et al., "Experimental techniques for the investigation of ferroelectric liquid crystals," *Liquid Crystals*, 1987, vol. 2, No. 2, pp. 121–130.

*Primary Examiner*—Kathryn L. Gorgos
*Assistant Examiner*—Edna Wong
*Attorney, Agent, or Firm*—Kenyon & Kenyon

[57] ABSTRACT

A method of preparing a pyroelectric mixture, especially for pyroelectric and piezoelectric components. At least two compounds are mixed in a prescribed ratio. One compound contains polymerizable and preferably achiral liquid-crystal monomers and the other a preferably achiral liquid-crystal polymer or copolymer. Each compound also contains hydrogen-bridging substituents. The mixture is heated to above its specific vitrification point. An electric field is applied to polymerize the monomer and polarize the mixture. The mixture is cooled to below its specific glass transition point with the field still present.

19 Claims, 11 Drawing Sheets

M6R8
Kr-54-S$_A$-96-I

M6R6
Kr-63-S$_A$-95-I

A6R8
Kr-59-S$_A$-119-I

PM6R8
g-93-S$_C$-184-I

PM6R6
g-82-S$_C$-156-S$_A$-174-I

PA6R8
g-60-S$_C$-180-I

METHOD OF PREPARING A PYROELECTRIC MIXTURE AND PYROELECTRIC DEVICE

FIELD OF THE INVENTION

The present invention concerns a method of preparing a pyroelectric mixture, especially for pyroelectric and piezoelectric components.

RELATED TECHNOLOGY

Many methods of manufacturing components with pyroelectric and piezoelectric properties are known. Conventional intensity detectors for use in the infrared range and dependent upon the pyroelectric effect accommodate infrared-sensitive components comprising a crystalline or polycrystalline material with pyroelectric properties, such as lithium niobate, glycine sulfate, lead titanate. etc. Such components ideally exhibit the most rapid reactivity possible along with high sensitivity. These sensitive components will accordingly be thinner than 20 $\mu$m (micrometers). On the other hand, since di-electric crystalline materials possess both high hardness and high cleavability, it is currently very difficult for practical purposes to make infrared-sensitive components of the desired largeness and shape.

Also known are ferroelectric materials from which sensitive pyroelectric and piezoelectric components can be made. Using pyroelectric and piezoelectric films of polymeric ferroelectrics is known. Kawai. "The piezoelectricity of poly(vinylidene fluoride)", Jpn. J. Appl. Phys. 8, 975 (1969), reports that the ferroelectric polymer polyvinylidine fluoride (PVDF) has a higher piezoelectric coefficient than any other known polymer. E. Yamaia. U.S. Pat. No. 3,707,695 (26 Dec. 1972), "Infrared Intensity Detector Using a Pyro-electric Polymer," discloses that the pyroelectric coefficient of PVDF is high enough to allow the material to be used as an infrared-sensitive film. PVDF can assume several different molecular and crystalline structures depending on what conditions the sample is manufactured under. The crystal form that exhibits ferroelectricity is sometimes called the I form or $\beta$ form. Mechanical and electric properties vary significantly with molecular conformation and with chain packing in the elementary cell. Both reversible and irreversible crystal modifications can be introduced subject to appropriate external conditions. PVDF films are usually subjected to special treatment (drawing and rolling for example) to increase the proportion of $\beta$ crystal forms. The films are then polarized by applying a very powerful electric field, resulting in films with high pyroelectric and piezoelectric coefficients.

Whereas ferroelectricity is achieved in polymers of the PVDF type by stretching, rolling, and polarizing the film and is accordingly not an inherent property of the untreated sample, spontaneous polarization will occur in liquid-crystal polymers with an intrinsic (low) symmetry $C_2$. The occurrence of ferroelectricity in liquid crystals is postulated by Meyer et al in "A material with ferroelectric chiral smectic C and H phases", Contribution to the 5th Int. Liquid Crystal Conference, Stockholm (1974). Their arguments are premised on symmetry. The authors predict the occurrence of spontaneous polarization in any lamellar system for tilted chiral molecules with a non-zero dipole moment perpendicular to the molecule's longitudinal axis. Based on this prediction, an early ferroelectric side-chain polymer was synthesized by Shibaev et al. as described in "Chiral smectic C* with spontaneous polarization", Polymer Bull. 12, 229 (1984). In comparison to small-molecule ferroelectric liquid crystals, which usually exist below the liquid-crystal phase as crystals, the vitreous state often occurs below that state in polymeric ferroelectric liquid crystals. It is accordingly possible to freeze in, below the glass transition point, a polar orientation induced by an electric field. The chiral ferroelectric liquid-crystal polymer is heated to above the vitrification point, oriented within the field, and cooled back down to the vitrification point in a constant-voltage field.

One known variation of the known version comprises the photo-induced polymerization of reactive molecules in the ferroelectric smectic C* phase in a constant-voltage field. This method yields highly transparent oriented networks with dipolar Hikmet orientation of the type he describes in "Piezoelectric networks obtained by photopolymerization of liquid-crystal molecules", Macromolecules 25, 5759 (1992). Known ferroelectric liquid-crystal polymers admittedly have only low piezoelectric and pyroelectric coefficients in the vitreous state.

The manufacture of thin ferroelectric films of polyurea by vapor-deposition polymerization (polymerization based on precipitation from the vapor phase) is described by Y. Takahashi et al in "Synthesis of aromatic polyimide film by vacuum deposition polymerization", J. Vacuum Sci. Technol. A5, 2253 (1987). Monomers are precipitated out of the vapor state and onto a substrate. They interreact to produce the urea compound. This is followed by a specific polarizing procedure comprising application of an electric field, increasing the temperature to approximately 200° C., and lowering it discontinuously with the field still present. Urea-based polymers exhibit average piezoelectric and pyroelectric coefficients, and these only at high temperatures.

Although ferroelectric polymers are distinguished by low thermal diffusivity, high plasticity, and low manufacturing costs, they are definitely less sensitive than inorganic solids. The pyroelectric reactivity and detectivity of ferroelectric polymers have been definitely lower than those of detectors that contain triglycine-sulfate (TGS) monocrystals or $PbTiO_3$ ceramics.

SUMMARY OF THE INVENTION

An object of the present invention is accordingly a simple method of preparing a pyroelectric mixture distinguished by high pyroelectric reactivity, a high grade, and a high pyroelectric coefficient.

The present invention therefore provides a method of preparing a pyroelectric mixture, especially for pyroelectric and piezoelectric components, comprising: a) mixing at least two compounds in a prescribed ratio, one compound containing polymerizable monomers and the other a polymer or copolymer, whereby each compound contains hydrogen-bridging substituents; b) heating the mixture to above its specific vitrification point: c) applying an electric field to polymerize the monomer and polarize the mixture; and d) cooling the mixture to below its specific vitrification point with the electric field still present.

Further advantageous developments include that the compounds are achiral and that a liquid-crystal monomer and or a liquid-crystal polymer may be employed. In addition, the periodically recurring structural unit of the polymer or at least one unit of those that constitute the copolymer has at least one hydroxyl group. The monomer also may have a hydroxyl group. These hydroxyl groups can then serve as the hydrogen bridging substituents. In addition, at least both compounds may have azomethine groups as the hydrogen bridging substituent. A paraelectric polymer or copolymer also may be employed, as may be a paraelectric monomer. A thin smear of the mixture may be obtained before the electric field is applied and the mixture may be cooled to produce a solid polar polymer film. Moreover, the ratio of polymer or copolymer to monomer ratio may be 2:1.

Thus, at least two compounds are combined in a prescribed ratio. One compound comprises polymerizable monomers and the other a polymer or copolymer. Each compound contains hydrogen-bridging substituents. The mixture is heated to above its specific vitrification point. An electric and preferably constant-voltage electric field is applied to polymerize the monomer and polarize the mixture. The mixture is then cooled to below its specific vitrification point with the field still present. The result is solid, polar, and polymeric mixture with a pyroelectric coefficient at least as high as those of previous pyroelectric components of the PVDF type described above.

Achiral liquid-crystal monomers and/or an achiral liquid-crystal polymer or copolymer are preferably employed. Chiral monomers and polymers are of course also possible.

The periodically recurring structural unit of the polymer or at least one unit of those that constitute the copolymer has at least one hydroxyl group. The monomer also has at least on hydroxyl group.

Azomethine groups advantageously may be used as the hydrogen-bridging substituents.

Both the polymer and the copolymer as well as the particular monomer employed exhibit the paraelectric state.

The mixture in accordance with the present invention can be employed to construct pyroelectric radiation detectors, vidicon disks, and piezoelectric transducers.

To manufacture a very thin pyroelectric component, one less than 20 μm thick, a very thin smear of the mixture is prepared before the electric field is applied. This can be done by filling a flat capillary with mixture or by spin-coating. Subsequent cooling will produce a solid polar polymer film.

The highest pyroelectric coefficients can be obtained with a polymer-to-monomer or copolymer-to-monomer ratio of 2:1.

BRIEF DESCRIPTION OF THE DRAWINGS

The present invention will now be specified with reference to the accompanying drawings, wherein.

DETAILED DESCRIPTION

Figure 3:
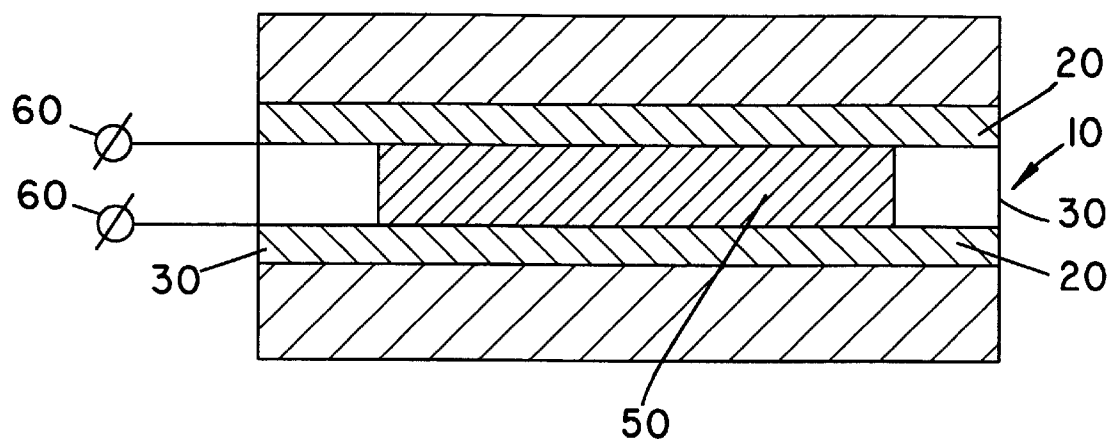
FIG. 3 is a schematic illustration of a cell wherein a thin pyroelectric component can be produced in accordance with the present invention.

FIG. 3 illustrates a cell 10 wherein a thin solid polar polymeric film for example can be produced by the method in accordance with the present invention. Cell 10 includes two electrodes in the form of ITO-coated glass plates 20. 20' separated 10 μm for example by spacers 30 of Teflon for example.

Plates 20 and 20' together constitute a laminar capacitor, wherein an electrostatic field can be created. The monomers, which are in a mixture 50 that is intended to be transformed into a film, are polymerized and the mixture itself polarized by means of the field. It will be of advantage for the commercially available ITO-coated plates 20 and 20' to have an electrode resistance of 100 $\Omega/cm^2$. The precise distance between the electrodes can of course vary, but will average only a few μm. Cell 10 is filled with the mixture 50 of liquid-crystal substances. The mixture can for example comprise two compounds. One compound can comprise polymerizable liquid-crystal monomers, three structural formulas for which are illustrated by way of example in FIG. 1. The second compound is a polymer, three different structural formulas for which are illustrated by way of example in FIG. 2. The liquid-crystal polymer employed in the present example has a polymerization degree of approximately 140. The mixture 50 of liquid-crystal substances will be in an isotropic or fluid liquid-crystal phase at high temperatures. Once mixture 50 has been heated in cell 10 to above its specific vitrification point, a constant voltage is applied to contacts 60, which connect to the glass-plate 20 and 20' electrodes. The electrostatic field accordingly produced between ITO-coated glass plates 20 and 20' electrically polymerizes the monomers and polarizes the mixture. The mixture is then cooled from the liquid-crystal state to the vitreous state in the presence of the same field. The product is a thin solid polar polymeric film with macroscopic polarization and with a pyroelectric coefficient at least as high as that of previous PVDF-type pyroelectric components described above. The pyroelectric coefficient of the mixture 50 prepared in accordance with the present invention is determined by the pyroelectric pulse method described by L. M. Blinov, V. A. Baikolov, M. I. Barnik. L. A. Beresnev. E. P. Pozhidayev, and S. V. Yablonsky in Liq. Cryst. 2, 121 (1987). which disclosure is hereby incorporated by reference herein, as is the disclosure from U.S. Pat. No. 3,707,695. The temperature dependence of the macroscopic polarization may be determined by integrating the pyroelectric coefficient over temperature in accordance with the equation:

$$P_s = \int_{T_c}^{T} \nu dT$$

wherein $T_c$ is the temperature at the transition into the paraelectric phase. To determine the piezoelectric coefficient $d_{31}$, the piezoelectric method was employed at lower frequencies. The piezoelectric coefficient was calculated from the formula $$d_{31} = VC/4LR\Delta p$$

wherein $\Delta p$ is the applied acoustic pressure. V the piezoelectric response (voltage) to the acoustic frequency. L the length of penetration, and R the radius of the work.

Mixtures of appropriate compounds appropriate for the method in accordance with the present invention will now be specified by way of example along with their antiferroelectric properties.

Figure 1A:
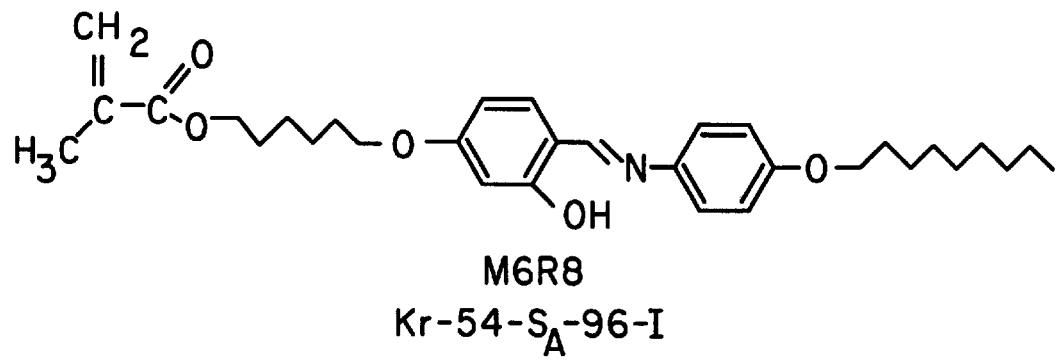
FIGS. 1a–c illustrate examples of the chemical structure of various liquid-crystal monomers that can participate in the mixture produced in accordance with the present invention.
Figure 2A:
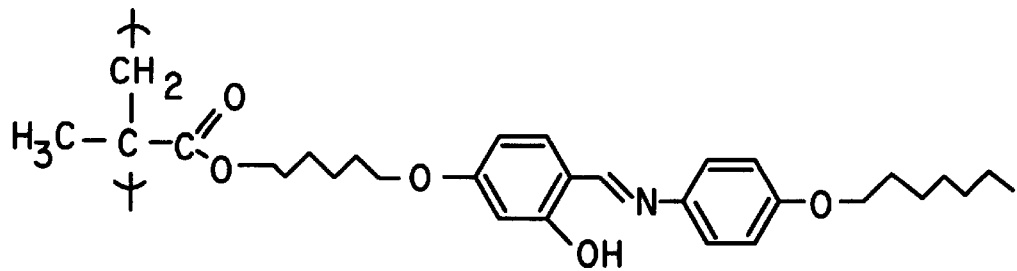
FIGS. 2a–c illustrate examples of the chemical structure of liquid-crystal polymers that can also participate in the mixture produced in accordance with the present invention.
Figure 5:
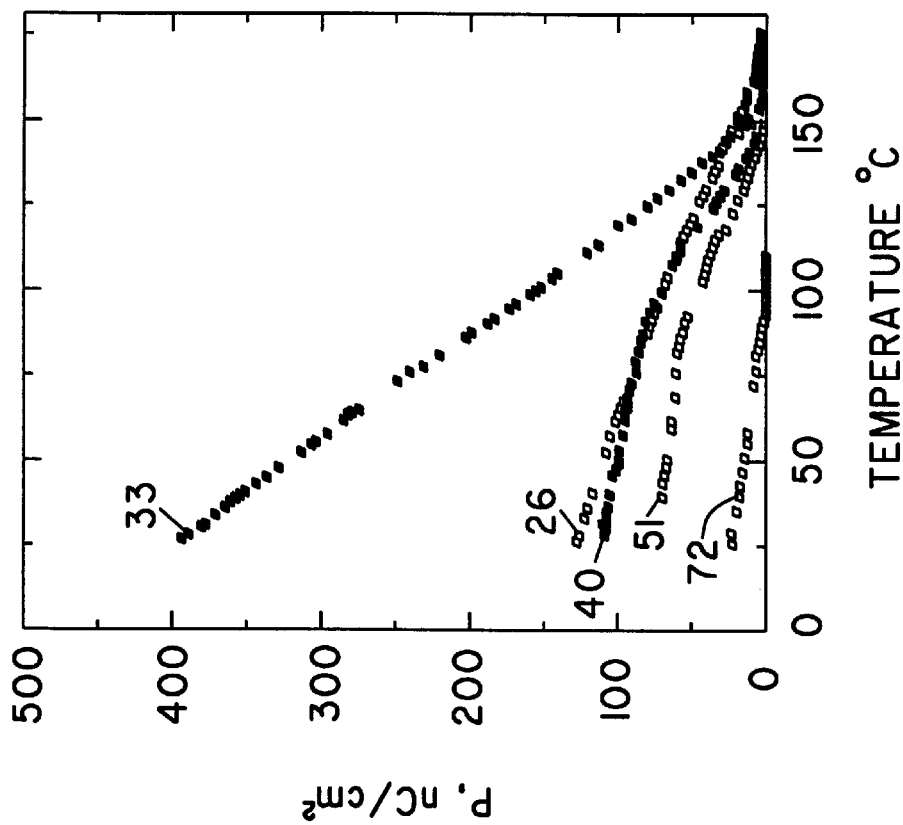
FIG. 5 is a graph of macroscopic polarization as a function of temperature for a mixture of PM6R8 and M6R8 at five different monomer concentrations.
Figure 4:
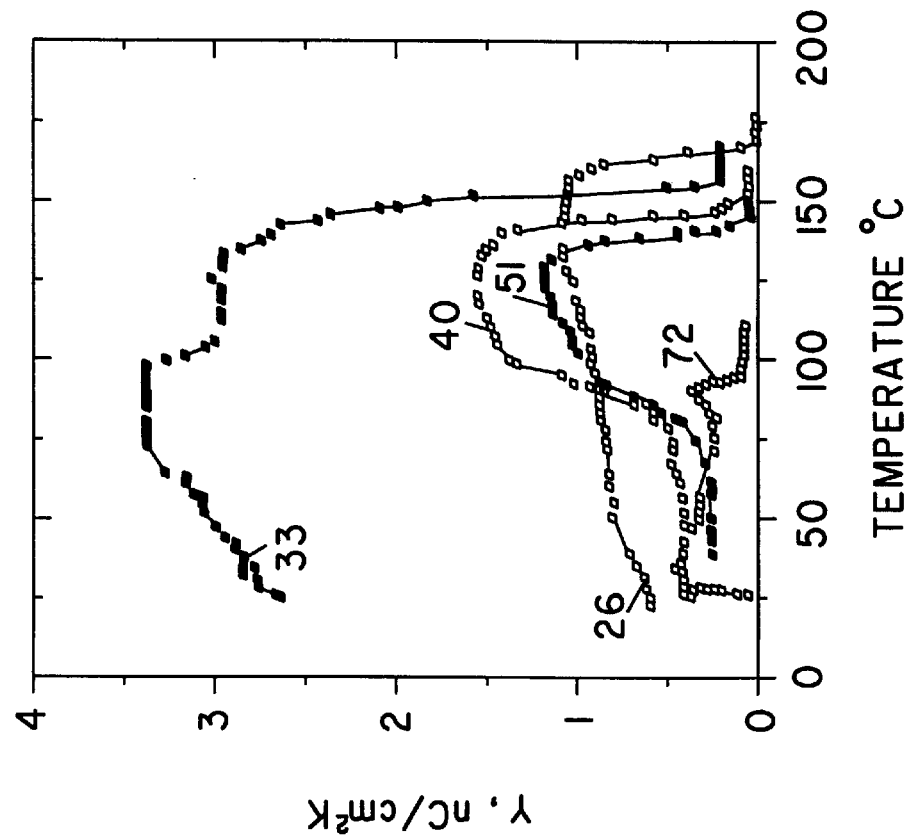
FIG. 4 is a graph of pyroelectric coefficient as a function of temperature for a mixture of PM6R8 and M6R8 at five different monomer concentrations
Figure 7:
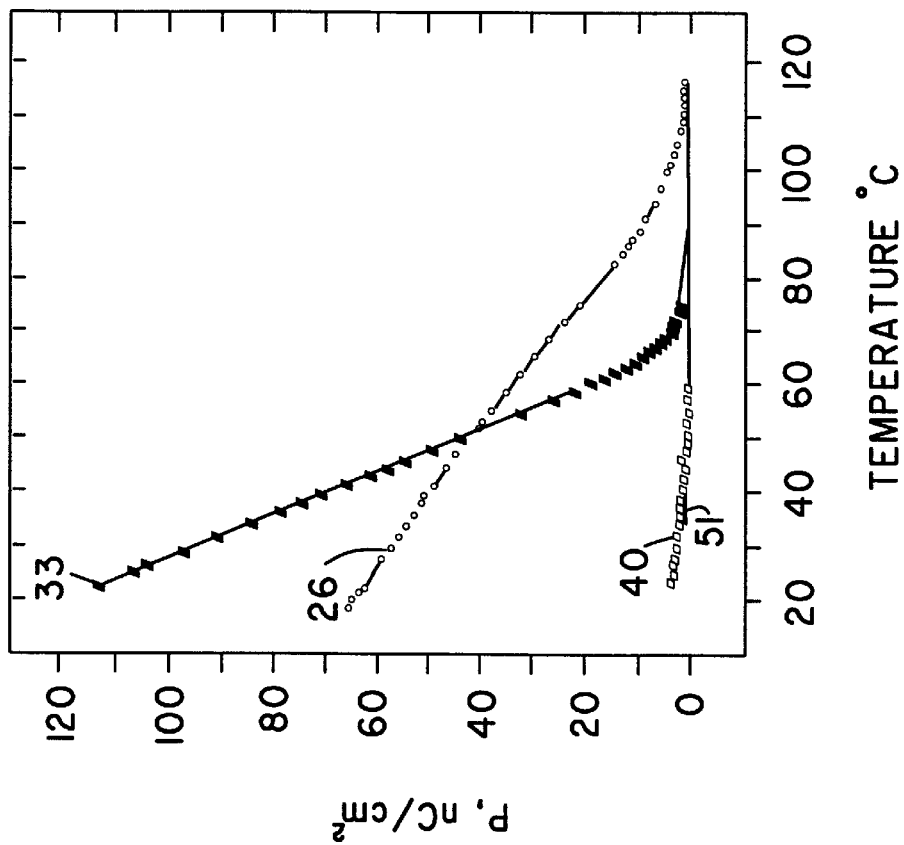
FIG. 7 is a graph of macroscopic polarization as a function of temperature for mixtures of PM6R8 and M6R8 at four different monomer concentrations.
Figure 6:
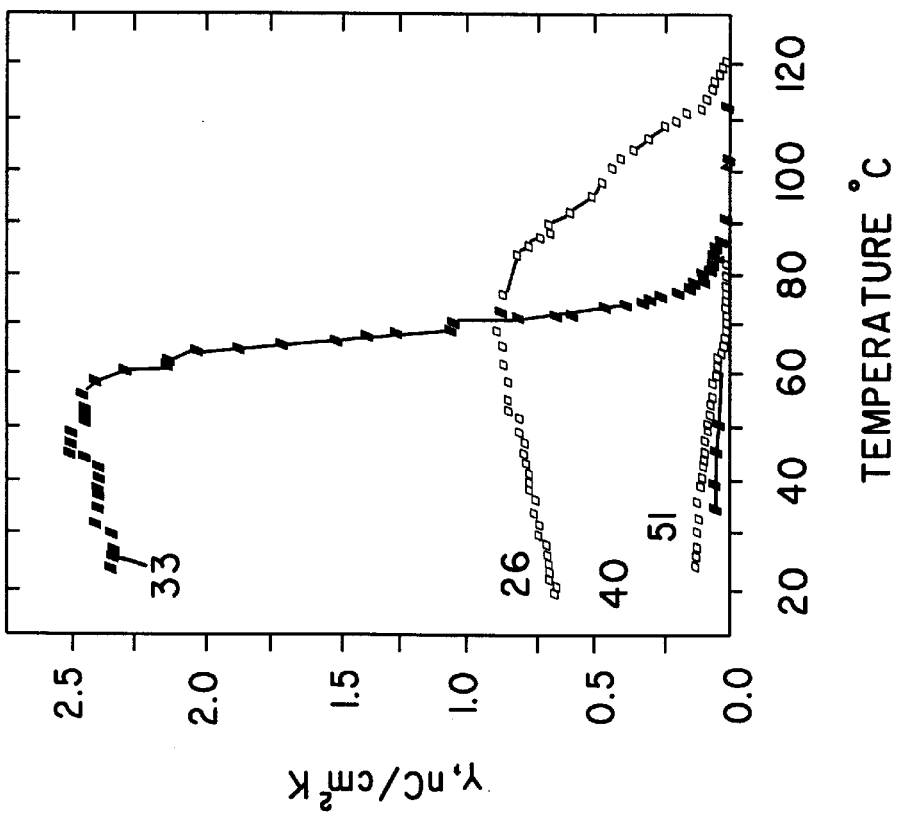
FIG. 6 is a graph of pyroelectric coefficient as a function of temperature for mixtures of PM6R8 and M6R8 with at four different monomer concentrations.
Figure 8:
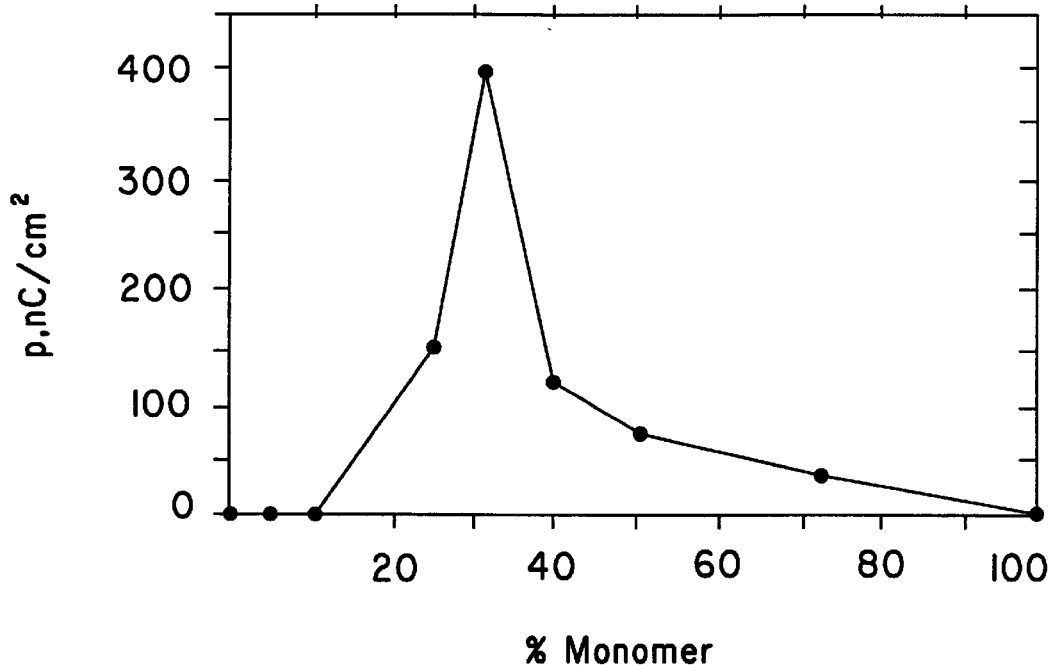
FIG. 8 is a curve representing the maximal pyro-electric coefficient for the mixture of PM6R8 and M6R8 as a function of monomer concentration.
Figure 9:
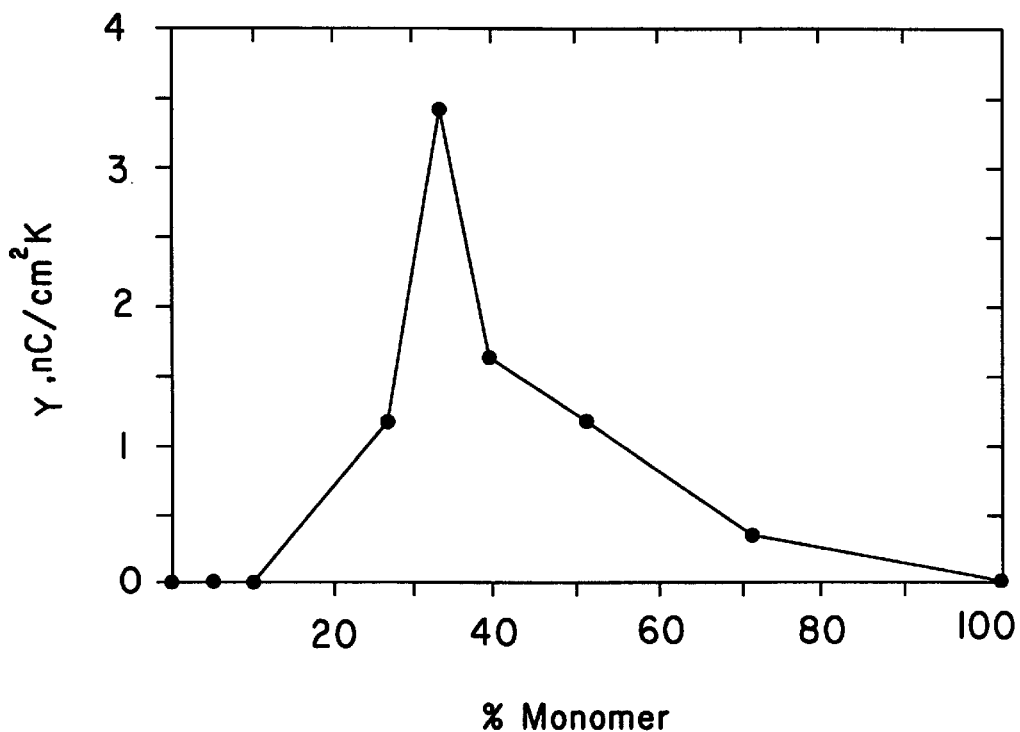
FIG. 9 is a curve representing maximal macroscopic polarization at room temperature for the mixture of PM6R8 and PM6R8 as a function of monomer concentration.
Figure 10B:
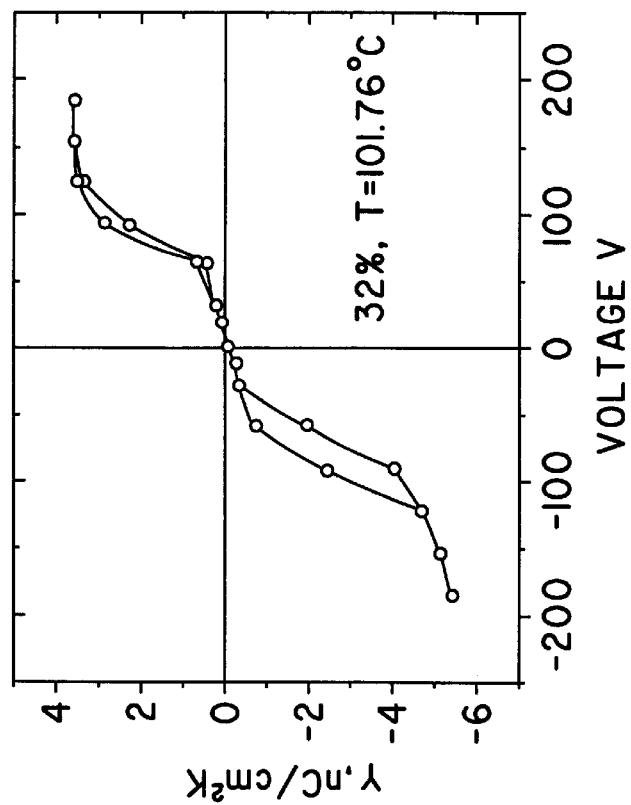
FIG. 10 illustrates antiferroelectric hysteresis with a pyro-electric coefficient depending on an applied constant voltage at four differently concentrated mixtures of PM6R8 and PM6R8.
Figure 10A:
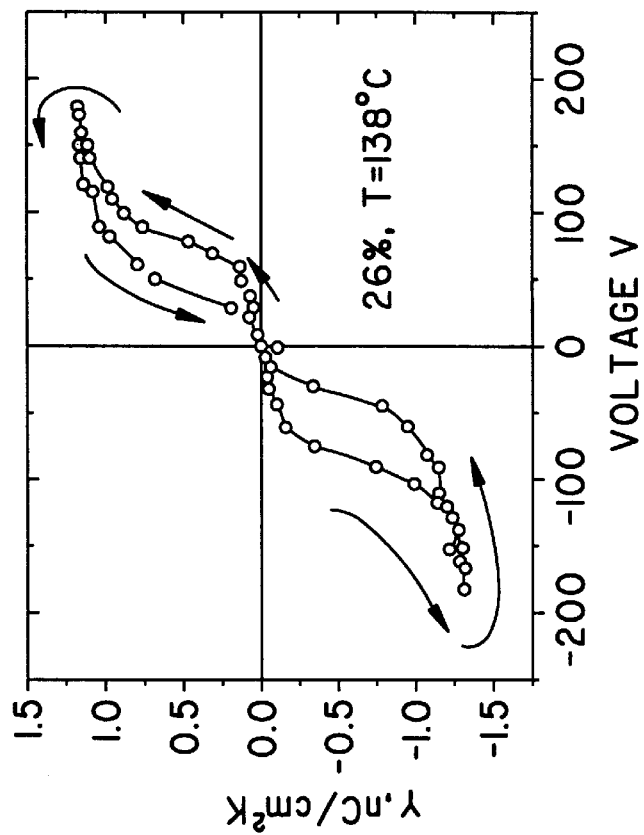
Figure 10D:
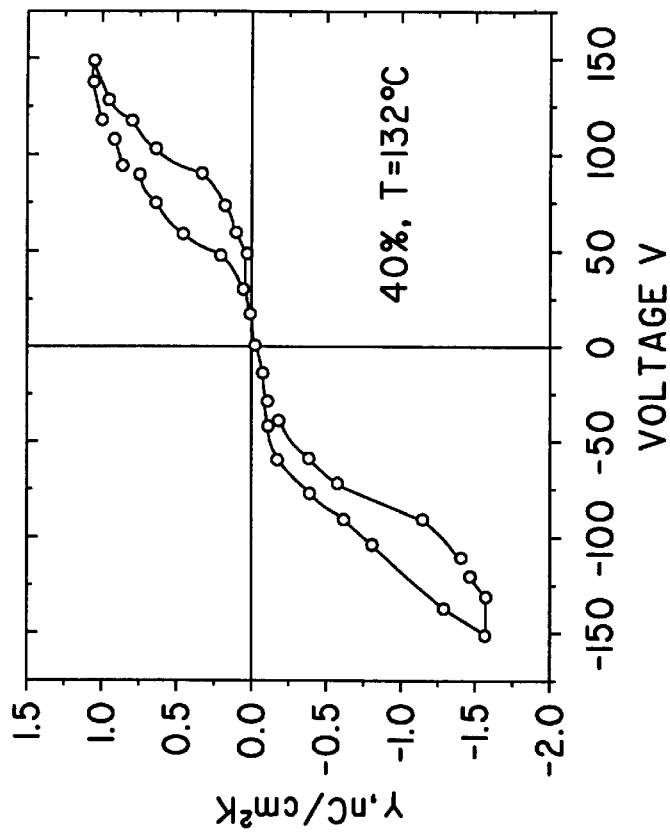
Figure 10C:
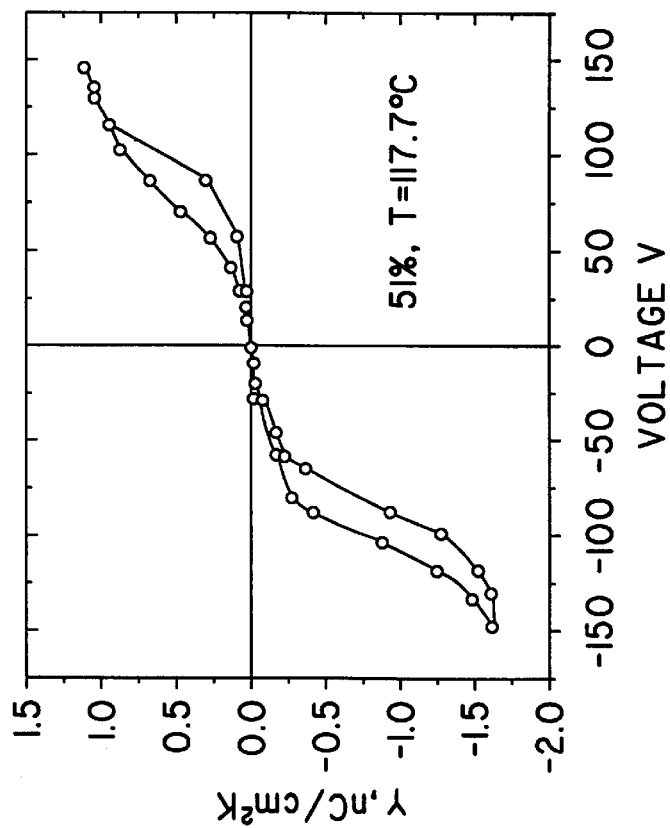
Figure 11:
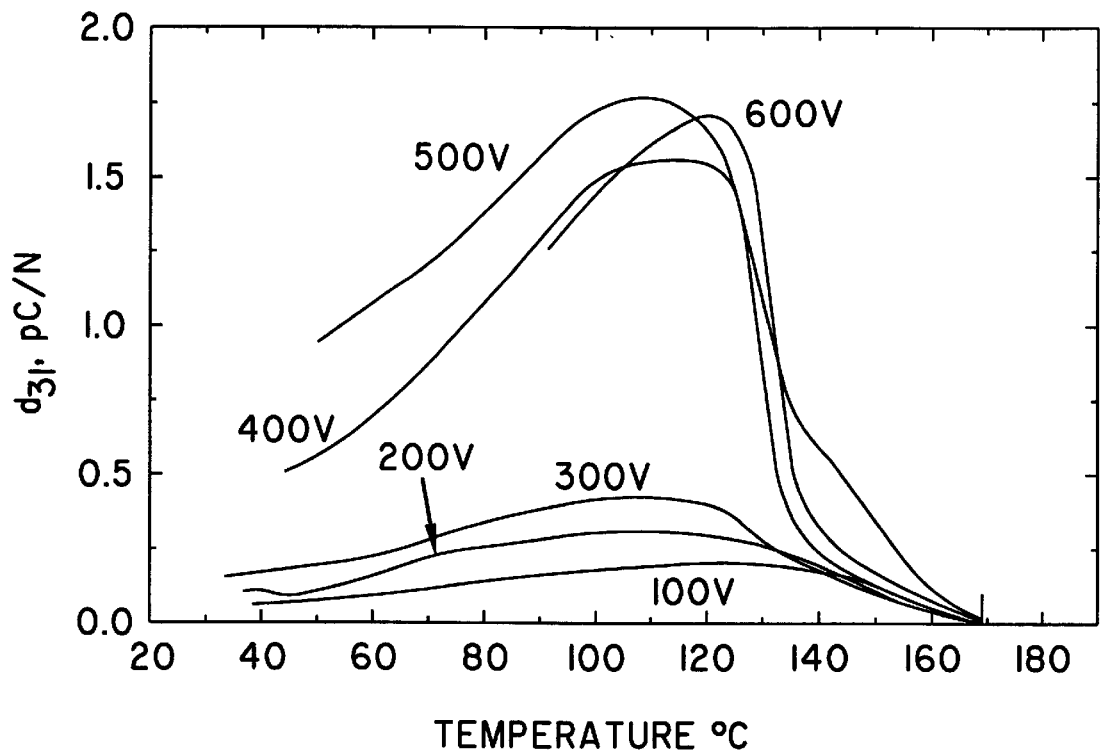
FIG. 11 is a graph of the piezoelectric coefficient $d_{31}$ as a function of temperature for a mixture comprising 74% PM6R8 and 26% PM6R8 with voltage as the parameter.

The first example concerns a mixture 50 containing the liquid-crystal side-chain polymer polymethacrylate PM6R8 whereof the structural formula is illustrated in FIG. 2a and the associated monomer M6R8 represented in FIG. 1a. FIG. 4 illustrates five curves representing the temperature dependence of the pyroelectric coefficients of five different concentrations of monomer M6R8. The curves are plotted for monomer concentrations of 26, 33, 40, 51, and 72%. All percentages are by weight. The results were all accompanied by cooling the mixture to room temperature in an constant-voltage electric field with a strength of 12 V/$\mu$m. FIG. 5 illustrates five curves representing macroscopic polarization of the aforesaid mixture as a function of temperature with monomer concentration as parameter. It will be evident from the curves in FIGS. 4 and 5 that pyroelectric coefficient and macroscopic polarization are at their maxima at a 33% concentration of monomer in the mixture. FIGS. 6 and 7 each illustrate four pyroelectric coefficients and spontaneous polarizations for variously polarized mixtures of the polymer PM6R8 and its associated monomer M6R8 as a function of temperature with monomer concentration as parameter. These results were obtained while the mixture was being heated from room temperature to the clarification point. The mixture with the highest pyroelectric coefficient and macroscopic polarization is again obtained at a monomer concentration of 33% by weight. Between room temperature and the specific vitrification point of 65° C. the pyroelectric coefficient ranges from 2.3 to 2.5 nC/cm$^2$K. FIGS. 8 and 9 illustrate the pyroelectric coefficient and macroscopic polarization of the mixture of PM6R8 and M6R8 as a function of monomer concentration. The characteristic maximum for the mixture occurs at a polymer-to-monomer ratio of 2:1. FIG. 10 illustrates four typical antiferroelectric hysteresis curves representing the dependence of the pyroelectric coefficient on the constant-voltage field for mixtures with various concentrations of polymer and monomer. The arrows indicate the sequence of the mixture's treatment with the electric field and its resulting properties. Here, reversal of the polarity of the constant voltage varies the mathematical sign of the pyroelectric signal. Complete re-orientation of macroscopic polarization required a switching time $\tau$ of 10 seconds and an electric-field strength of 10 V/$\mu$m. FIG. 11 illustrates piezoelectric coefficient $d_{31}$ as a function of temperature for a mixture of 74% PM6R8 and 26% M6R8 with the applied constant voltage as parameter. The mixtures were polarized by the constant-voltage field. Although the field did not saturate the mixture, a piezoelectric coefficient $d_{31}$ of 1 PC/N was attained at room temperature.

Figure 1B:
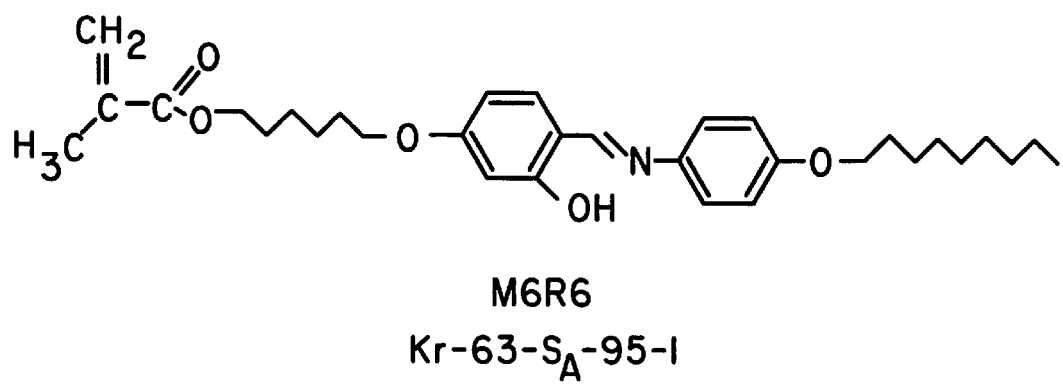
Figure 2B:
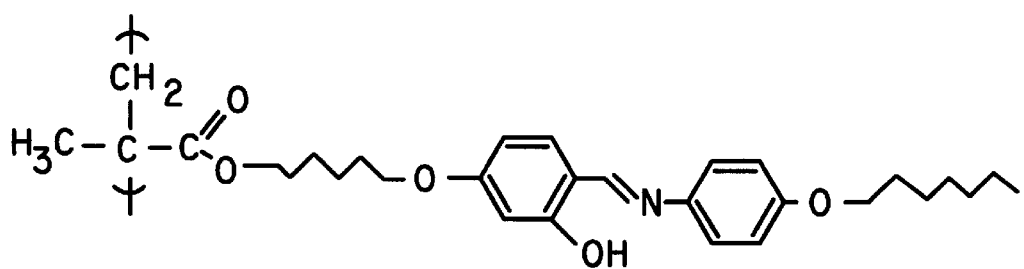
Figure 12:
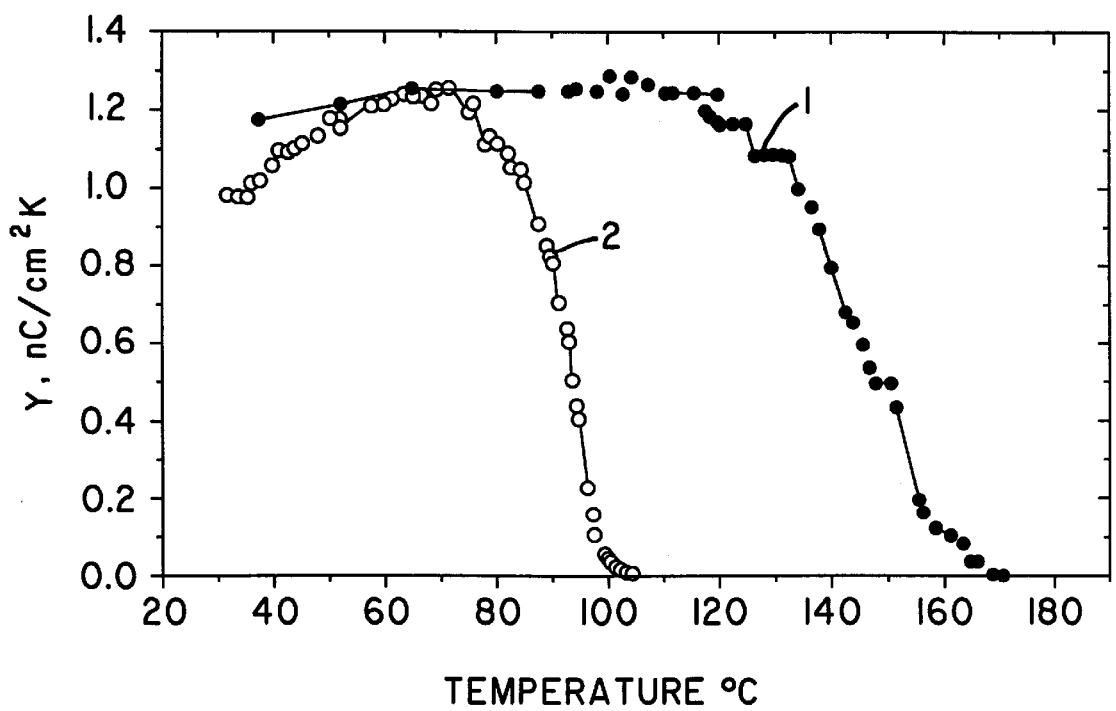
FIG. 12 is a graph of the pyroelectric coefficient as a function of temperature for the mixture comprising 74% PM6R8 and 26% PM6R8 with voltage as the parameter.
Figure 13:
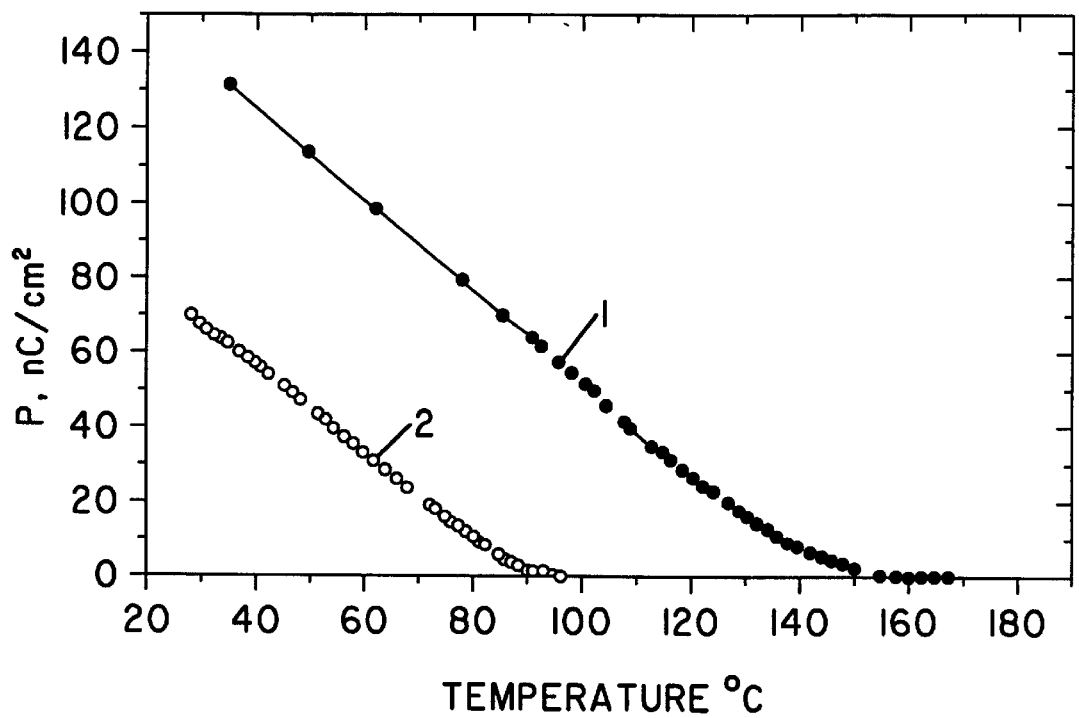
FIG. 13 is a graph of macroscopic polarization as a function of temperature for the mixture comprising 74% PM6R8 and 26% PM6R8.
Figure 14:
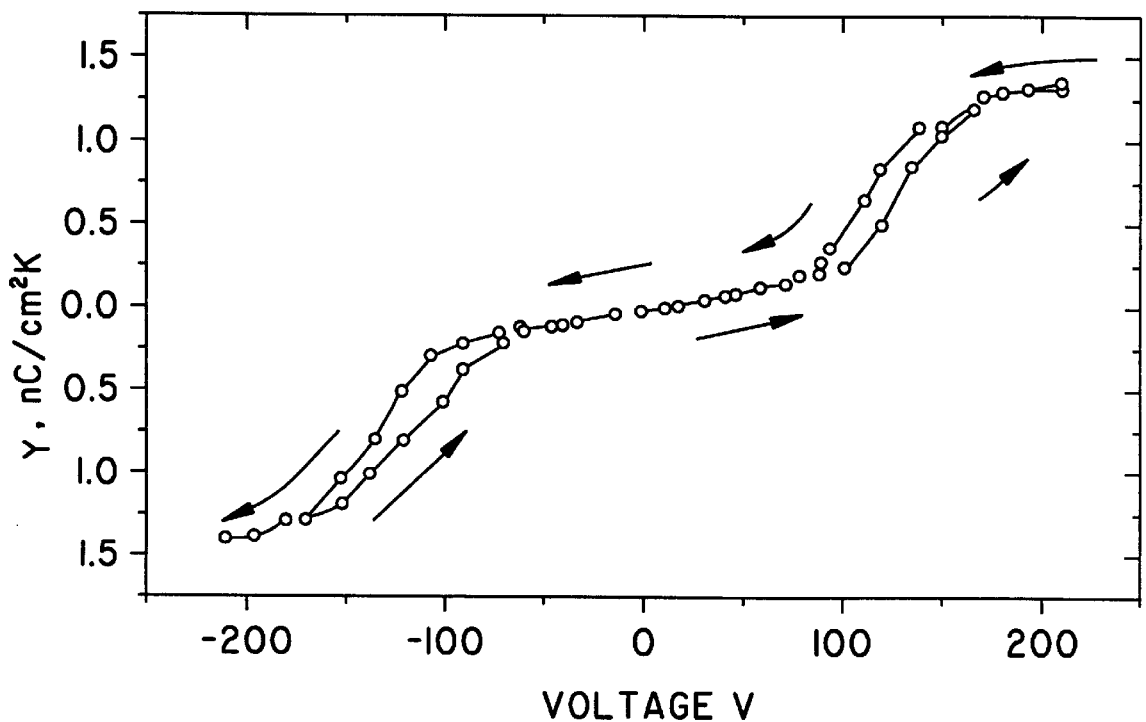
FIG. 14 illustrates antiferroelectric hysteresis for a mixture of 67% PM6R8 and 33% M6R8.

Another example investigated was a mixture of 67% PM6R8 and 33% M6R6. Their structural formulas are illustrated in FIGS. 2b and 1b. FIGS. 12 and 13 illustrate the pyroelectric coefficients and macroscopic polarizations of the mixture as a function of temperature. The curves I in FIGS. 12 and 13 were obtained while the mixture was being cooled in a constant-voltage field of 12 V/$\mu$m. The curves 2 in FIGS. 12 and 13 were obtained while the mixture was being heated in the absence of an electric field. FIG. 14 illustrates the antiferroelectric hysteresis of this mixture. Complete re-orientation of the macroscopic polarization required a switching time of 10 seconds and an electric-field strength of 20 V/$\mu$m.

Figure 1C:
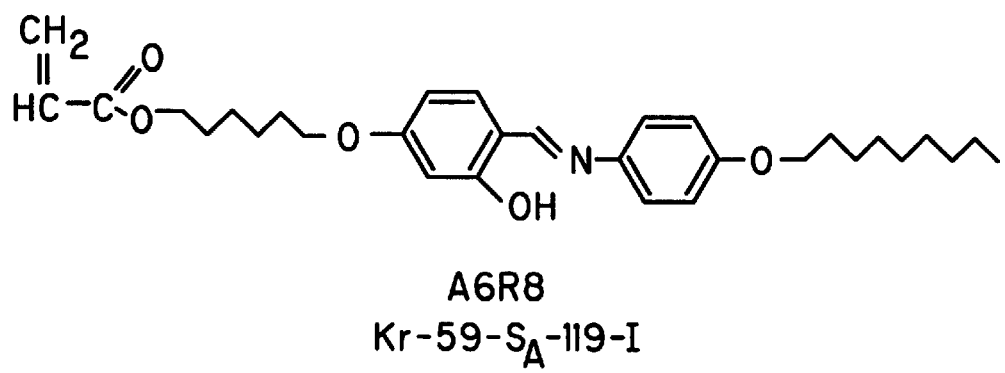
Figure 2C:
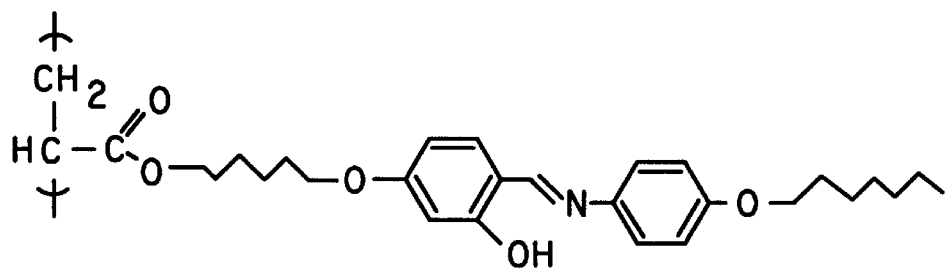
Figure 15:
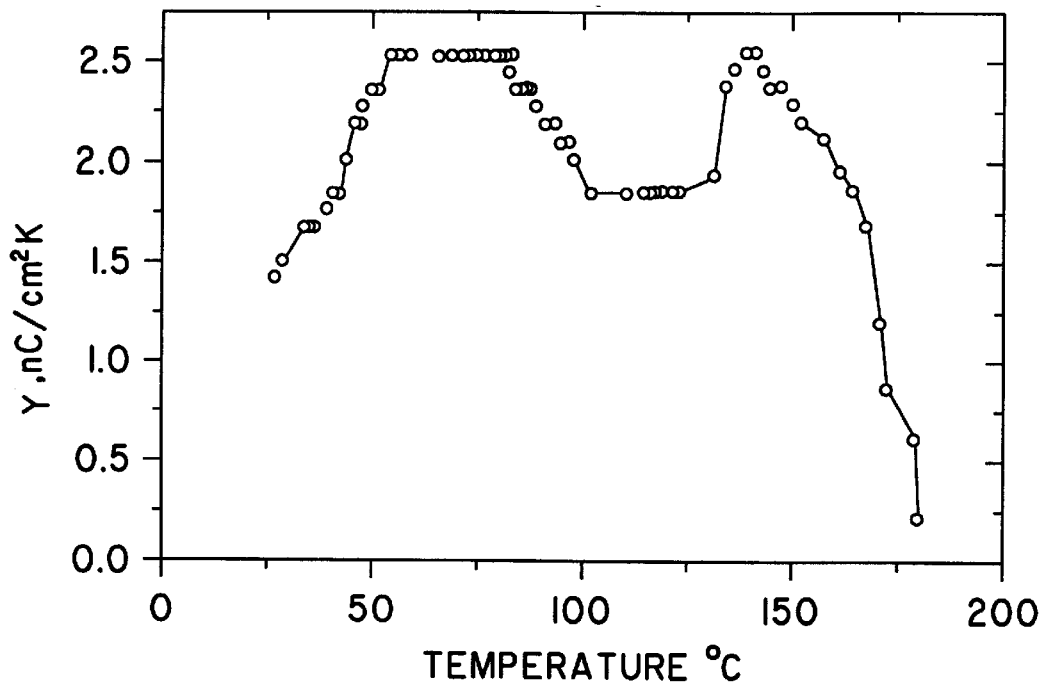
FIG. 15 illustrates pyroelectric coefficient as a function of temperature for a mixture of 67% PA6R6 and 33% A6R8.
Figure 16:
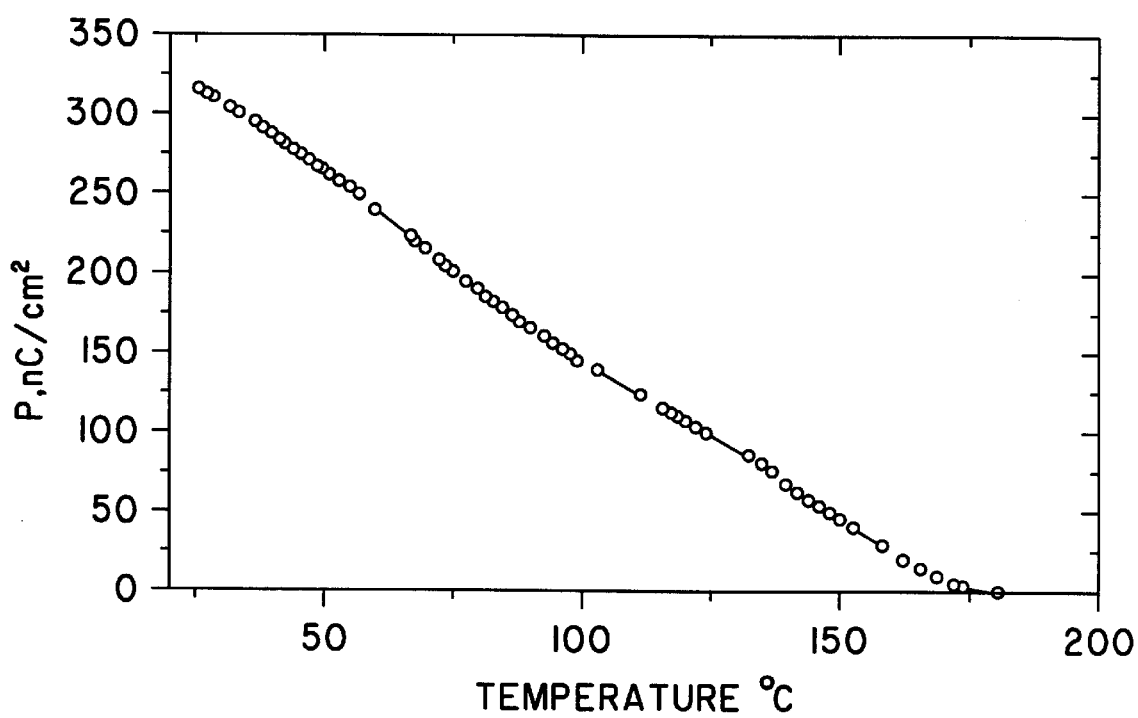
FIG. 16 illustrates macroscopic polarization as a function of temperature for the mixture of 67% PA6R6 and 33% A6R8.

The third example is a mixture of the liquid-crystal polyacrylate PA6R8 with mesogenic side chains illustrated in FIG. 2c and its associated monomer A6R8, illustrated in FIG. 1c. The ratio of polymer to monomer is 67 to 33%. FIGS. 15 and 16 illustrate the temperature dependence of the mixture's pyroelectric coefficient and macroscopic polarization. These results were obtained while the mixture was being cooled in a constant-voltage field of 12 V/$\mu$m.

Table 1 illustrates other mixtures of polymerizable polymers and monomers, all containing hydrogen-bridging substituents, that were investigated along with their pyroelectric coefficients spontaneous polarization, and grade.

TABLE 1

| Materials | Pyroelectric coefficient $\gamma$, [nC/cm$^2$K] | Spontaneous polarization $P_S$ [nC/cm$^2$] | Grade $\gamma/cc_n\epsilon'$ [Vcm$^2$/J] |
|---|---|---|---|
| PM6R8 + 33% M6R8 | 2.36 | 395 | 4820 |
| PM6R8 + 26% M6R8 | 0.67 | 130 | 3229 |
| PM6R8 + 40% M6R8 | 0.11 | 110 | 224 |
| PM6R8 + 51% M6R8 | 0.04 | 72 | 82 |
| PM6R6 + 33% M6R6 | 0.97 | 70 | 1980 |
| PM6R8 + 33% A6R8 | 1.45 | 315 | 2960 | wherein $\epsilon' = 2.4 \epsilon_0$ and $C_{72} = 2.3 J/cm^3$.

The permittivity of each polymer was determined at 1 KHz and at room temperature. The grade of each material was obtained from its permittivity $\epsilon' = 2.4 \epsilon_0$ and heat capacity $C_n = 2.37 J/cm^3$.

The present invention makes it possible to make polar polymer films with outstanding antiferroelectric properties. Films produced in accordance with the present invention can be employed for example as sensitive components in piezoelectric and pyroelectric detectors. Another aspect of the present invention is the controlled induction of a polar system in liquid crystals based on an appropriate modification of the monomer concentration in the polymer matrix.

What is claimed is:

1. A method of preparing a pyro-electric mixture comprising the steps of:

mixing at least two compounds in a prescribed ratio, one compound including polymerizable monomers and the other a polymer or copolymer, each compound including hydrogen-bridging substituents;

heating the mixture to above a specific glass transition point of the mixture;

applying an electric field to polymerize the polymerizable monomers and polarize the mixture; and cooling the mixture to below the specific glass transition point in contact with the electric field.

2. The method as recited in claim 1 wherein the compounds are achiral.

3. The method as recited in claim 1 wherein the compounds are chiral.

4. The method as recited in claim 1 wherein the monomers are in a liquid-crystal phase during at least one step.

5. The method as recited in claim 1 wherein the polymer is in a liquid-crystal phase during at least one step.

6. The method as recited in claim 1 wherein a periodically recurring structural unit of the polymer or at least one unit that constitutes the copolymer has at least one hydroxyl group.

7. The method as recited in claim 1 wherein the monomer has at least one hydroxyl group.

8. The method as recited in claim 1 wherein at least one of said at least two compounds has an azomethine group.

9. The method as recited in claim 1 wherein at least two of said at least two compounds have an azomethine group.

10. The method as recited in claim 1 wherein the polymer or copolymer is in a paraelectric state during at least one step.

11. The method as recited in claim 1 wherein the monomer is in a paraelectric state during at least one step.

12. The method as recited in claim 1 further comprising the step of producing a thin smear of the mixture before applying the electric field.

13. The method as recited in claim 1 wherein the cooling step produces a solid polar polymer film.

14. The method as recited in claim 1 wherein the prescribed ratio of polymer or copolymer to monomer is 2:1.

15. A method of preparing a pyroelectric mixture comprising the steps of:

preparing a mixture of at least two compounds, one compound including monomers and the other compound including polymers or copolymers; at least one of the at least two compounds includes hydrogen-bridging substituents;

polarizing the mixture by an electric field; and curing the mixture so that it retains its polarization.

16. The method as recited in claim 15 wherein the curing step includes heating the mixture to at least a glass transition point of the mixture and cooling the mixture in contact with the electric field.

17. The method as recited in claim 15 wherein the hydrogen-bridging substituents include hydroxyl groups.

18. The method as recited in claim 15 wherein the hydrogen-bridging substituents include azomethine groups.

19. The method as recited in claim 15 wherein a ratio of polymer or copolymer to monomer is 2:1.

* * * * *